United States Patent [19]
Houk et al.

[11] Patent Number: 5,313,067
[45] Date of Patent: May 17, 1994

[54] ION PROCESSING APPARATUS INCLUDING PLASMA ION SOURCE AND MASS SPECTROMETER FOR ION DEPOSITION, ION IMPLANTATION, OR ISOTOPE SEPARATION

[75] Inventors: Robert S. Houk; Ke Hu, both of Ames, Iowa

[73] Assignee: Iowa State University Research Foundation, Inc., Ames, Iowa

[21] Appl. No.: 888,613

[22] Filed: May 27, 1992

[51] Int. Cl.$^5$ ........................................ H01J 37/317
[52] U.S. Cl. .......................... 250/452.21; 250/398; 250/423 R
[58] Field of Search ............. 250/492.21, 423 R, 288, 250/398; 315/111.51

[56] References Cited

U.S. PATENT DOCUMENTS

| | | | |
|---|---|---|---|
| 3,434,894 | 3/1969 | Gale | 250/492.21 |
| 3,786,359 | 1/1974 | King | 250/492.21 |
| 3,944,826 | 3/1976 | Gray . | |
| 4,385,946 | 5/1983 | Finegan et al. | 250/492.21 |
| 4,703,180 | 10/1987 | Taya | 250/492.21 |
| 4,760,253 | 7/1988 | Hutton | 250/281 |
| 4,766,320 | 8/1988 | Naitoh et al. . | |
| 4,897,282 | 1/1990 | Kniseley et al. . | |
| 4,933,650 | 6/1990 | Okamoto | 315/39 |
| 5,051,584 | 9/1991 | Gray et al. | 250/281 |
| 5,063,294 | 11/1991 | Kawata et al. | 250/492.21 |
| 5,132,545 | 7/1992 | Shono et al. | 250/492.21 |

FOREIGN PATENT DOCUMENTS

| | | | |
|---|---|---|---|
| 124499 | 11/1974 | Japan | 250/492.21 |
| 1-95458 | 4/1989 | Japan . | |

OTHER PUBLICATIONS

K. Eberhardt et al., "A Microwave Induced Plasma Operated at Atmospheric and Low Pressure as an Ion Source for a Mass Separator", *Spectrochimica Acta*, vol. 47B, No. 1, pp. 89-94, 1992.

*Primary Examiner*—Bruce C. Anderson
*Attorney, Agent, or Firm*—Antonelli, Terry, Stout & Kraus

[57] ABSTRACT

An ion processing apparatus for processing a target with ions includes a plasma ion source and a mass spectrometer for producing an ion beam for depositing ions onto the surface of the target to form a thin film or for implanting the ions into the target to modify the composition or properties of the target or for separation and collection of individual, separated isotopes. The plasma ion source is preferably an inductively coupled plasma ion source, and the mass spectrometer is preferably a quadrupole mass spectrometer. The stoichiometry of the deposited or implanted ions can be adjusted by controlling the mass spectrometer to produce an ion beam having a desired composition. Mixtures of different elements can be easily deposited or implanted in any desired stoichiometry by introducing a multielement sample into the plasma ion source and controlling the time the mass spectrometer transmits each element to be deposited or implanted.

17 Claims, 2 Drawing Sheets

ION PROCESSING APPARATUS INCLUDING PLASMA ION SOURCE AND MASS SPECTROMETER FOR ION DEPOSITION, ION IMPLANTATION, OR ISOTOPE SEPARATION

GRANT REFERENCE

The U.S. Government has certain rights in the present invention pursuant to Grant No. ITA 87-02 between the U.S. Department of Commerce and Iowa State University.

BACKGROUND OF THE INVENTION

The present invention is directed to an ion processing apparatus for processing a target with ions, and more particularly to an ion processing apparatus including a plasma ion source and a mass spectrometer for ion deposition for depositing ions onto the surface of a target to form a thin film on the target, for ion implantation for implanting ions into a target to modify the composition or properties of the target, or for isotope separation to prepare bulk amounts of highly enriched, stable isotopes.

Ion processing apparatuses for processing a target with ions are known in the art. For example, U.S. Pat. No. 4,766,320 discloses an ion implantation apparatus including an unspecified ion source and a magnetic-sector mass spectrometer. Japanese Patent Application Laid-Open No. 1-95458 discloses an ion implantation apparatus including an ion source and a quadrupole mass spectrometer. Absent an English translation of this reference, it is unclear if a particular type of ion source is specified.

Further, U.S. Pat. No. 4,897,282 which is assigned to the assignee of the present application discloses an apparatus for forming a thin film on a target. Finely divided particles of a coating material to be deposited on a target are introduced into an inductively coupled plasma (ICP) torch in a stream of a carrier gas such as argon. The coating material is vaporized by plasma heating in the ICP torch. The vaporized coating material passes through a first orifice in a sampler into a first vacuum zone and then through a second orifice in a skimmer into a second vacuum zone. The vaporized coating material is cooled below its melting temperature as it passes through the first and second vacuum zones, and is subsequently deposited on a target disposed in the second vacuum zone in a solidified atomic, ionic, and/or molecular form to form a thin film.

In the apparatus of U.S. Pat. No. 4,897,282, the coating material is deposited directly on the target after it passes through the second orifice. No provision is made to guarantee the purity of the deposited coating material. This requires the use of a high-purity coating material if a high-purity thin film is desired. Also, no provision is made to remove unwanted background species passing through the second orifice such as neutral argon or argon ions from the plasma. Furthermore, while the stoichiometry of the thin film can be controlled by controlling the reaction conditions in the plasma, it is difficult to achieve precise control of the stoichiometry in this manner.

Ion processing apparatuses for isotope separation are also known in the art. Such an apparatus which uses a plasma ion source and a magnetic-sector mass spectrometer is disclosed in K. Eberhardt et al., "A Microwave Induced Plasma Operated at Atmospheric and Low Pressure as an Ion Source for a Mass Separator", Soectrochimica Acta, Vol. 47B, No. 1, pp. 89–94, 1992. This apparatus employs a microwave-induced plasma and is intended primarily for separation of radionuclides such as $^{235}U$; thus, the sample is introduced as a particle beam from a nuclear reactor. In contrast, the present application deals primarily with an inductively coupled plasma and is intended primarily for separation of stable isotopes introduced by nebulization or other simple sample introduction means.

SUMMARY OF THE INVENTION

It is therefore an object of the present invention to provide an ion processing apparatus capable of producing a high-purity beam of ions free of unwanted background species from a material to be deposited onto the surface of a target or implanted into the target which does not require a high-purity source of the material.

A further object of the present invention is to provide an ion processing apparatus for depositing material onto the surface of a target or implanting the material into the target which enables the stoichiometry or isotope purity of the deposited or implanted material to be easily controlled.

In order to achieve the above objects, an ion processing apparatus for processing a target with ions according to the present invention includes a plasma ion source and a mass spectrometer for producing an ion beam for depositing ions onto the surface of the target to form a thin film or for implanting the ions into the target to modify the composition or properties of the target. The plasma ion source is preferably an inductively coupled plasma ion-source, and the mass spectrometer is preferably a quadrupole mass spectrometer. The stoichiometry of the deposited or implanted ions can be controlled by controlling the mass spectrometer to produce an ion beam having a desired composition. Mixtures of different elements can be easily deposited or implanted in any desired stoichiometry by introducing a multielement sample into the plasma ion source and controlling the time the mass spectrometer transmits each element to be deposited or implanted. Alternatively, a similar apparatus can also be used for isotope separation.

These and further objects, features, and advantages of the present invention will become more apparent from the following description when taken in conjunction with the accompanying drawings which show, for the purpose of illustration only, an embodiment of the present invention.

DESCRIPTION OF THE PREFERRED EMBODIMENT

Figure 1:
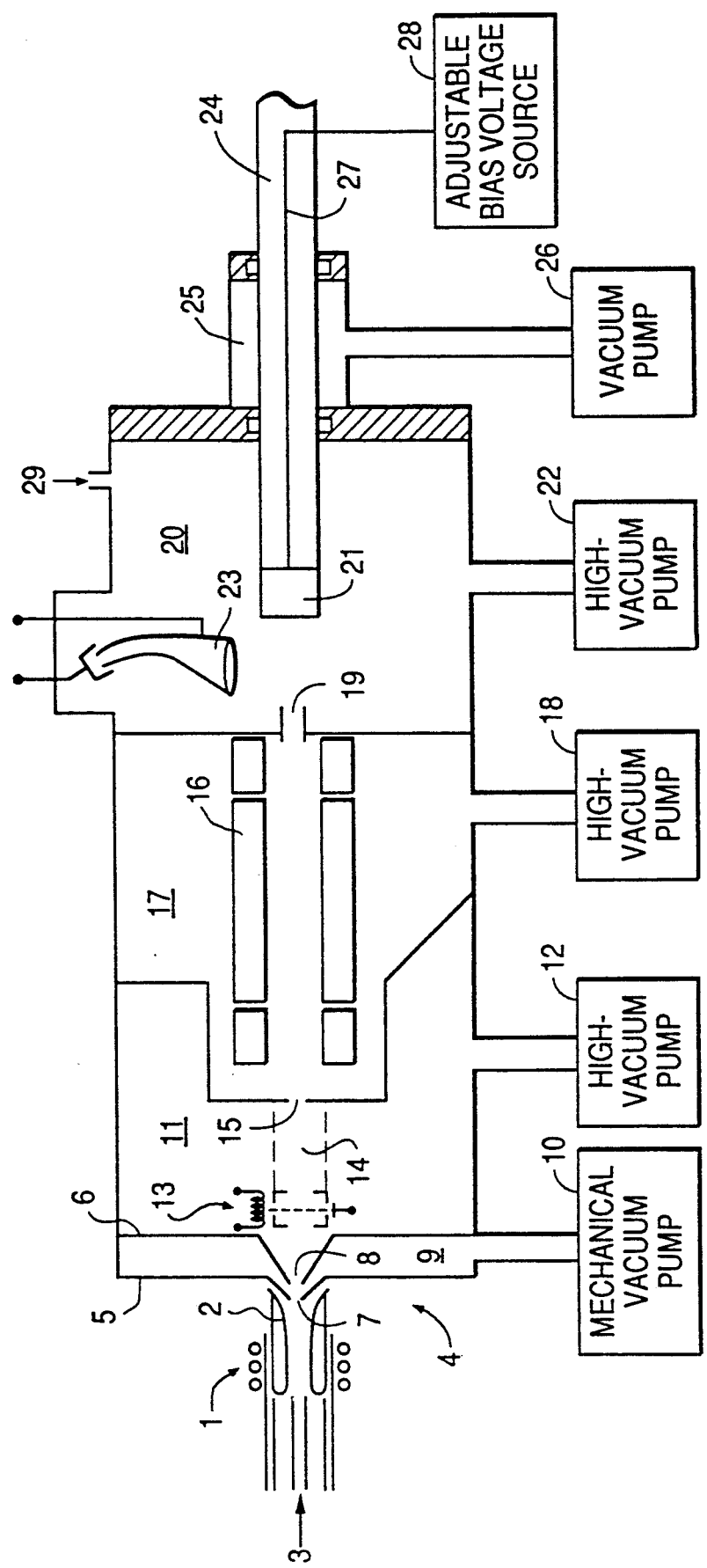
FIG. 1 shows an ion processing apparatus according to the present invention.

FIG. 1 shows an inductively coupled plasma-mass spectrometry (ICP-MS) apparatus constituting an ion processing apparatus according to the present invention. Referring to FIG. 1, the ion processing apparatus includes a conventional inductively coupled plasma (ICP) torch 1 for producing an inductively coupled plasma 2. A sample 3 constituting material to be deposited onto or implanted into a target 21 is introduced into the ICP torch 1 where the sample 3 is vaporized and atomized by the plasma 2.

The sample 3 can be a gas, a liquid aerosol, or a powder, or can be particles produced by laser ablation, electrothermal vaporization, or ancillary electrical discharge. Various methods of producing such samples are known in the art, and thus will not be discussed in detail here. U.S. Pat. No. 3,944,826 is illustrative of such methods. Alternatively, solid samples can be inserted directly into the plasma.

The plasma conditions in the ICP torch 1 can be adjusted to produce positive ions such as $W^+$ or $Ta^+$ or negative ions such as $F^-$ or $Cl^{31}$ from the sample 3, although with most plasmas, positive ions are predominant. Alternatively, the plasma conditions can be adjusted to produce neutral atoms and/or neutral molecules (neutrals) such as metal oxides from the sample 3.

The use of the plasma 2 to vaporize and atomize the sample 3 makes it easy to change the material to be deposited onto the target 21 or implanted into the target 21 merely by changing the sample 3. The relatively high pressure and temperature in the plasma 2 lead to efficient vaporization, dissociation, and ionization of the sample 3, resulting in a high population of ions from the elements of the sample 3. Furthermore, the use of the plasma 2 makes it easy to produce neutral atoms or atomic ions from elements that form refractory oxides such as Ta or the rare earths. These elements are otherwise very difficult to vaporize and atomize.

Ions and/or neutrals are sampled from the plasma 2 with a plasma sampling interface 4 including a sampler 5 and a skimmer 6 provided with respective orifices 7 and 8. The plasma sampling interface 4 may be the conventional type in which both the sampler 5 and the skimmer 6 are grounded or may be another conventional type, but is preferably the improved type disclosed in the applicants' copending U.S. patent application Ser. No. 888,620 filed concurrently with the present application and entitled "Plasma Sampling Interface for Inductively Coupled Mass Spectrometry (ICP-MS)".

A first vacuum chamber 9 between the sampler 5 and the skimmer 6 is evacuated by a mechanical vacuum pump 10 such as a rotary pump or a Roots pump to a pressure of approximately 1 torr. A second vacuum chamber 11 downstream of the skimmer 6 is evacuated by a high-vacuum pump 12 such as a diffusion pump to a pressure of approximately $10^{-4}$ torr.

An optional auxiliary ionization device 13 is provided in the second vacuum chamber 11 to ionize neutrals sampled from the plasma 2 when the plasma conditions are adjusted to produce neutrals as discussed above. Examples of suitable ionization techniques for the auxiliary ionization device 13 are electron impact, electrical discharge, chemical ionization, and photoionization. However, as will be apparent to one of ordinary skill in the art, other known ionization techniques may also be employed.

The ions sampled from the plasma 2 by the plasma sampling interface 4 or produced by the auxiliary ionization device 13 or both are directed by ion transfer optics 14 to a differential pumping aperture 15. Neutrals remaining in the second vacuum chamber 11 are pumped away by the high-vacuum pump 12.

After passing through the differential pumping aperture 15, the ions are analyzed by a conventional mass spectrometer 16 disposed in a third vacuum chamber 17 evacuated by a high-vacuum pump 18 to a pressure of approximately $10^{-5}$ torr. The mass spectrometer 16 is preferably a quadrupole mass spectrometer. The mass/-charge ratio m/Z transmitted by the mass spectrometer 16 is controlled to produce an ion beam having a desired composition for processing the target 21. Mixtures of different elements can be easily deposited or implanted in any desired stoichiometry by introducing a multielement sample 3 into the ICP torch 1 and controlling the time the mass spectrometer 16 transmits the m/Z value corresponding to each element to be deposited or implanted.

The ion beam from the mass spectrometer 16 exits through an exit aperture 19 into a fourth vacuum chamber 20 in which the target 21 is disposed. The fourth vacuum chamber 20 is evacuated by a high-vacuum pump 22 to a pressure of approximately $10^{-6}$ torr or less. A detector 23 is provided in the fourth vacuum chamber 20 for intercepting the ion beam and measuring doses of elements in the ion beam prior to and/or during processing of the target 21. The mass spectrometer 16 can be controlled to adjust the composition of the ion beam based on the measured doses of elements.

The target 21 is mounted on a probe 24 inserted into the fourth vacuum chamber 20 through a vacuum interlock 25 evacuated by a vacuum pump 26 which may be a mechanical vacuum pump or a high-vacuum pump to a pressure of approximately $10^{-2}$ torr or less. The probe 24 is provided with a voltage feedthrough 27 to enable a bias voltage to be applied to the target 21 from an adjustable bias voltage source 28.

If the adjustable bias voltage source 28 is adjusted to apply a relatively low bias voltage (e.g. 5 V) to the target 21, the ions in the ion beam will hit the surface of the target 21 softly, i.e with low kinetic energy, and will be deposited onto the surface of the target 21, thereby forming a thin film on the surface of the target 21. If the adjustable bias voltage source 28 is adjusted to apply a relatively high bias voltage (e.g. 5 kV or greater) to the target 21, the ions in the ion beam will hit the surface of the target 21 with high kinetic energy and will be implanted into the target 21, thereby modifying the composition or properties of the target 21.

The low pressure in the fourth vacuum chamber 20 enables the target 21 to be processed with the ion beam without contamination by or reaction with a residual gas in the fourth vacuum chamber 20. However, a reactive gas 29 can be deliberately introduced into the fourth vacuum chamber 20 to produce a chemical reaction between the ions in the ion beam and the reactive ga 29 during the processing of the target 21. This makes it possible to change the result of the processing without changing the composition of the sample 3, the plasma conditions in the ICP torch 1, or the composition of the ion beam. For example, a superconducting film can be produced by depositing the required metal atoms, such as Y, Ba, and Cu, in the desired relative amounts onto the surface of the target 21, and then introducing a gas 29 containing oxygen into the fourth vacuum chamber 20 under conditions that allow a superconducting oxide film to form on the surface of the target 21 upon exposure to the gas 29.

The plasma sampling interface 4 and the vacuum system of the apparatus are designed to tolerate as high a concentration of the elements of the sample 3 as possible to enable the ion beam from the mass spectrometer 16 to be made as intense as possible. For example, the respective orifices 7 and 8 in the sampler 5 and the skimmer 6 are made as wide as possible, for example, 1.3 mm or more in diameter, so that they will not plug up with solids condensed from the vaporized and atomized sample 3. This results in a high gas load through the sampler 5 and the skimmer 6, which requires the vacuum system to have sufficient pumping speed to maintain a low enough pressure to ensure proper operation of the mass spectrometer 16 and to prevent unwanted contamination of the target 2 with residual gas in the vacuum system.

The use of the mass spectrometer 16 provides the apparatus according to the present invention with significant advantages over the apparatus disclosed in U.S. Pat. No. 4,897,282 mentioned above, in that the mass spectrometer 16 enables an ion beam of high purity to be produced even if the sample 3 introduced into the ICP torch 1 is not particularly pure merely by controlling the mass spectrometer 16 to cause the ion beam to have the desired purity. Furthermore, the mass spectrometer 16 enables the deposited or implanted ions to have any desired stoichiometry merely by controlling the time the mass spectrometer 16 transmits the m/Z value corresponding to each element to be deposited or implanted to provide the desired stoichiometry.

Figure 2:
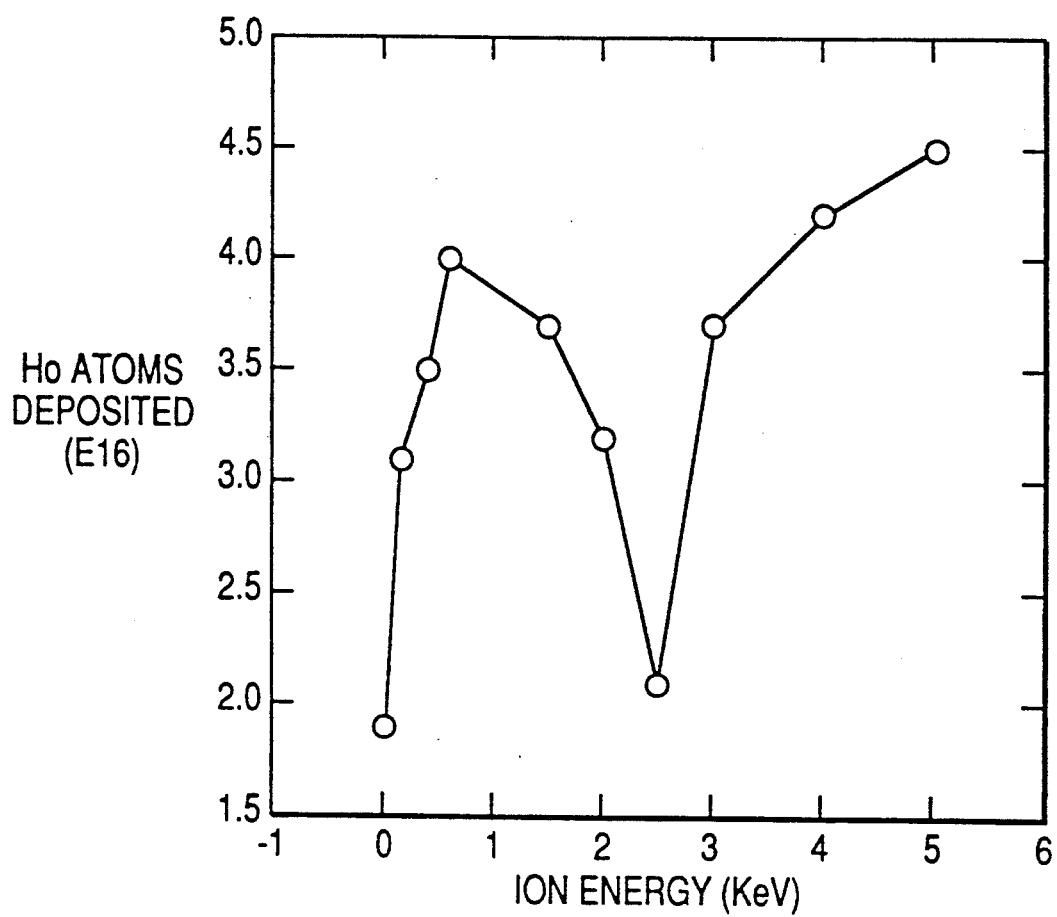
FIG. 2 shows a measured ion dose in units of total Ho atoms deposited as a function of ion kinetic energy obtained with the apparatus in FIG. 1.

FIG. 2 shows a measured ion dose in units of total Ho atoms deposited on a graphite target as a function of ion kinetic energy obtained with the apparatus in FIG. 1. The leftmost point corresponds to an ion energy of 10 eV. Each point in FIG. 2 represents a deposition run of 2.5 hours, followed by dissolution of the Ho from the graphite target and measurement of the Ho concentration by inductively coupled plasma-mass spectrometry (ICP-MS).

When corrected for deposition time, dose rates of $5 \times 10^{12}$ ions/sec are possible at the ion energies corresponding to the maxima in FIG. 2 (approximately 0.8 keV and 5 keV). This represents an ion beam intensity that is greater by a factor of $10^4$ than that achievable in a conventional ICP-MS apparatus. Alterations to the nebulizer used to introduce the sample to the plasma, to the sizes of the orifices in the sampler and the skimmer, to the spacing between the sampler and skimmer, and to the ion lens and mass analyzer produced this $10^4$ improvement. The refinements to the plasma sampling interface (described in the applicant's copending U.S. patent application Ser. No. 888,620, filed concurrently with the present application, were not use when the data in FIG. 2 were measured. Such refinements would be expected to increase the ion beam intensity still further beyond that shown in FIG. 2.

While the embodiment of the present invention shown in FIG. 1 uses an inductively coupled plasma, other types of plasma, such as a DC arc plasma or a microwave induced plasma as disclosed in U.S. Pat. No. 3,944,826 mentioned above, can be used instead. Furthermore, while the embodiment of the present invention discussed above uses a quadrupole mass spectrometer, other types of mass spectrometers, such as a magnetic-sector mass spectrometer, can be used instead. The mass analyzer technology commonly employed in isotope separation which employs a very large magnetic sector with multiple targets (i.e., one target for each isotope to be collected), can also be adapted for use with a plasma ion source. Also, while the auxiliary ionization device 13 is provided in the second vacuum chamber 11 in FIG. 1, it can be provided in either the first vacuum chamber 9 or the third vacuum chamber 17 in FIG. 1 instead.

While the present invention has been described in some detail with respect to the particular embodiment shown in FIG. 1, it will be appreciated by one of ordinary skill in the art that the present invention is subject to many modifications. The present invention is intended to encompass all such modifications, and the scope of the present invention is to be determined solely with reference to the appended claims.

We claim:

1. An ion processing apparatus for processing a target with ions, comprising:

a plasma source for producing a plasma;

sample introducing means for introducing a sample into the plasma to vaporize and atomize the sample;

plasma sampling means for sampling the plasma containing the vaporized and atomized sample;

a mass spectrometer for analyzing ions from the sampled plasma to produce an ion beam to be directed onto a target so as to process the target with ions in the ion beam; and an adjustable bias voltage source for applying a bias voltage to the target.

2. An apparatus according to claim 1, wherein the adjustable bias voltage source is adjusted to apply a bias voltage to the target to cause the ions in the ion beam to be deposited onto a surface of the target, thereby forming a thin film on the surface of the target.

3. An apparatus according to claim 2, further comprising control means for controlling the mass spectrometer such that the ion beam has a desired composition, thereby controlling a stoichiometry of the thin film.

4. An apparatus according to claim 1, wherein the adjustable bias voltage source is adjusted to apply a bias voltage to the target to cause the ions in the ion beam to be implanted into the target, thereby modifying at least one of a composition and a property of the target.

5. An apparatus according to claim 4, further comprising control means for controlling the mass spectrometer such that the ion beam has a desired composition, thereby controlling a stoichiometry of the implanted ions.

6. An apparatus according to claim 1, further comprising control means for controlling the mass spectrometer such that the ion beam has a desired composition for processing the target.

7. An apparatus according to claim 6, further comprising a detector for intercepting the ion beam and measuring doses of elements in the ion beam at least one of prior to and during processing of the target with the ions in the ion beam, wherein the control means controls the mass spectrometer to adjust the composition of the ion beam based on the doses of elements measured by the detector such that the ion beam has the desired composition.

8. An apparatus according to claim 1, further comprising a vacuum chamber in which the target is disposed and a vacuum pump for producing a vacuum in the vacuum chamber prior to processing the target with the ions in the ion beam.

9. An apparatus according to claim 8, further comprising gas introducing means for introducing a gas into the vacuum chamber after the vacuum pump has produced the vacuum in the vacuum chamber such that the gas reacts with the ions in the ion beam during or after processing of the target with the ions in the ion beam to produce a desired result.

10. An apparatus according to claim 1, wherein the plasma source produces an inductively coupled plasma.

11. An apparatus according to claim 1, wherein the plasma source produces a microwave induced plasma.

12. An apparatus according to claim 1, wherein the plasma source produces a DC arc plasma.

13. An apparatus according to claim 1, wherein the plasma, sampling means includes a sampler and a skimmer.

14. An apparatus according to claim 1, further comprising auxiliary ionizing means for ionizing at least one of neutral atoms and neutral molecules in the sampled plasma to produce ions.

15. An apparatus according to claim 1, wherein the mass spectrometer is a quadrupole mass spectrometer.

16. An apparatus according to claim 1, wherein the mass spectrometer is a magnetic-sector mass spectrometer.

17. An apparatus according to claim 1, wherein the sample introduction system, plasma, ion extraction system, ion optics, mass analyzer, and target(s) are designed specifically for isolation and collection of bulk amounts of separated isotopes.

* * * * *